US012635322B2

(12) United States Patent
Zitzlsperger

(10) Patent No.: US 12,635,322 B2
(45) Date of Patent: May 19, 2026

(54) OPTOELECTRONIC SEMICONDUCTOR COMPONENT AND PRODUCTION METHOD

(71) Applicant: ams-OSRAM International GmbH, Regensburg (DE)

(72) Inventor: Michael Zitzlsperger, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 675 days.

(21) Appl. No.: 18/040,337

(22) PCT Filed: Aug. 3, 2021

(86) PCT No.: PCT/EP2021/071664
§ 371 (c)(1),
(2) Date: Feb. 2, 2023

(87) PCT Pub. No.: WO2022/033926
PCT Pub. Date: Feb. 17, 2022

(65) Prior Publication Data
US 2023/0268477 A1 Aug. 24, 2023

(30) Foreign Application Priority Data
Aug. 10, 2020 (DE) ..................... 10 2020 004 863.3

(51) Int. Cl.
*H10H 20/857* (2025.01)
*H10H 20/85* (2025.01)
(Continued)

(52) U.S. Cl.
CPC ...... *H10H 20/857* (2025.01); *H10H 20/8506* (2025.01); *H10W 90/00* (2026.01); *H10H 20/0364* (2025.01)

(58) Field of Classification Search
None
See application file for complete search history.

(56) References Cited

U.S. PATENT DOCUMENTS

2005/0001219 A1* 1/2005 Minamio ................ H10F 77/50
257/E31.117
2012/0313131 A1* 12/2012 Oda ..................... H10H 20/854
257/E33.072
(Continued)

FOREIGN PATENT DOCUMENTS

DE      10 2017 128 457      6/2019
DE      10 2018 101 813      8/2019
WO         2013/092395      6/2013

OTHER PUBLICATIONS

International Search Report dated Nov. 25, 2021, in International Application No. PCT/EP2021/071664, with English translation.
(Continued)

*Primary Examiner* — Feifei Yeung Lopez
(74) *Attorney, Agent, or Firm* — DLA Piper LLP (US)

(57) ABSTRACT

An optoelectronic semiconductor component includes at least one optoelectronic semiconductor chip, a plurality of lead frame parts, a casting body that mechanically connects the lead frame parts to one another so that a mounting carrier is formed on which the at least one optoelectronic semiconductor chip is mounted, and a plurality of metallizations, wherein the lead frame parts are each formed in one piece and comprise at least one through-plating region and at least one mounting region, the through-plating regions each penetrate the mounting carrier and the mounting regions project beyond the casting body, and the metallizations each start from at least one of the through-plating regions and extend directly onto the casting body laterally next to the at least one associated through-plating region.

19 Claims, 14 Drawing Sheets

(51) Int. Cl.
  *H10W 90/00* (2026.01)
  *H10H 20/01* (2025.01)

(56) References Cited

U.S. PATENT DOCUMENTS

| | | | |
|---|---|---|---|
| 2013/0017631 | A1 | 1/2013 | Takeda et al. |
| 2014/0299911 | A1* | 10/2014 | Zitzlsperger ......... H10H 20/857 |
| | | | 438/18 |
| 2016/0056358 | A1* | 2/2016 | Moosburger ....... H10H 20/8506 |
| | | | 438/22 |
| 2018/0175267 | A1* | 6/2018 | Hirasawa ............. H10H 20/856 |
| 2018/0254226 | A1* | 9/2018 | Iguchi ................. H01L 25/0753 |
| 2019/0103313 | A1* | 4/2019 | Tam ...................... H01L 23/544 |
| 2020/0287111 | A1 | 9/2020 | Schwarz et al. |
| 2020/0402943 | A1 | 12/2020 | Hien et al. |

OTHER PUBLICATIONS

Haesung DS: Semiconductor Artisan, Lead Frame, Routable QFN, printout of Overview/Outline from StdT www_haesungds_com, Copyright 2020.

* cited by examiner

FIG 15
FIG 16
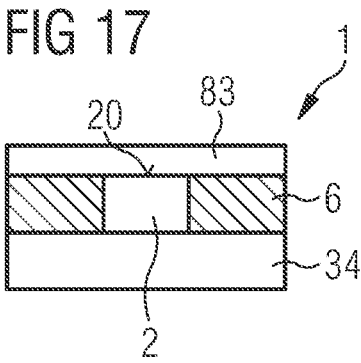
FIG 17
FIG 18
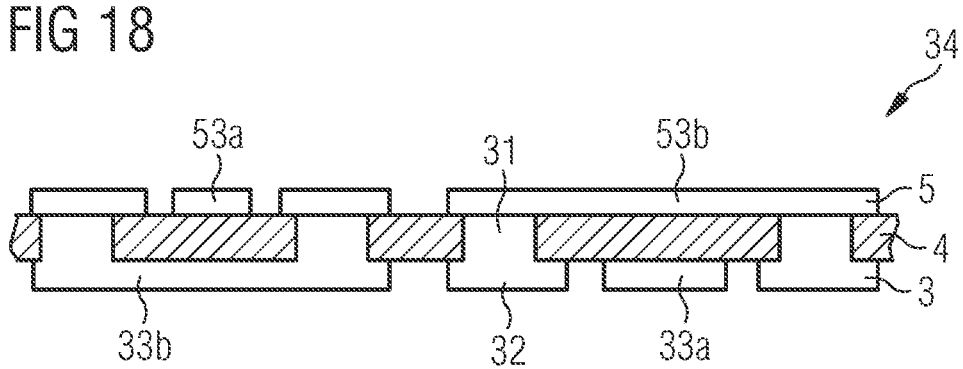

FIG 37
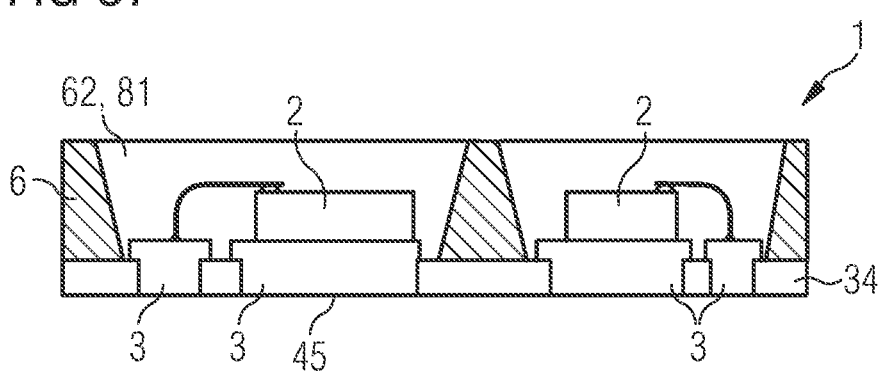
FIG 38
FIG 39
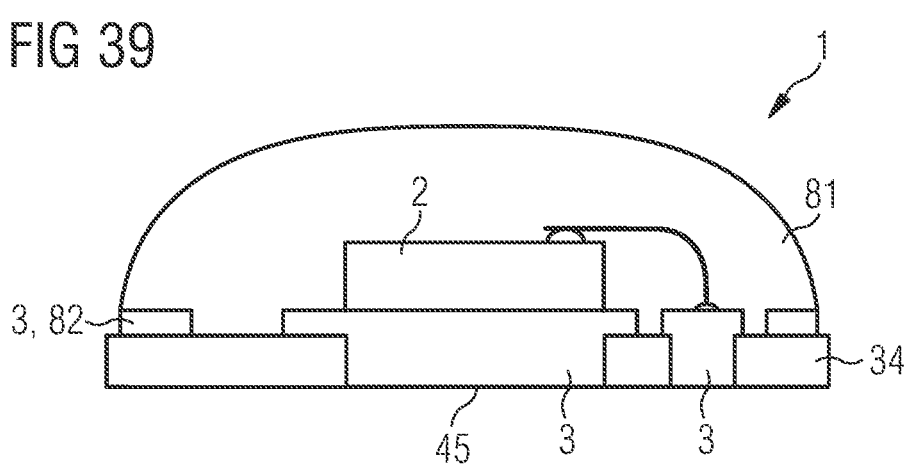

OPTOELECTRONIC SEMICONDUCTOR COMPONENT AND PRODUCTION METHOD

TECHNICAL FIELD

This disclosure relates to an optoelectronic semiconductor component, and a method of manufacturing such optoelectronic semiconductor components.

BACKGROUND

Haesung DS, a manufacturer from Seoul, South Korea, offers QFN substrates with conductor tracks, also known as routable QFNs or Rt-QFNs for short.

There is nonetheless a need to provide an optoelectronic semiconductor component that can be manufactured efficiently.

SUMMARY

I provide an optoelectronic semiconductor component including at least one optoelectronic semiconductor chip, a plurality of lead frame parts, a casting body that mechanically connects the lead frame parts to one another so that a mounting carrier is formed on which the at least one optoelectronic semiconductor chip is mounted, and a plurality of metallizations, wherein the lead frame parts are each formed in one piece and includes at least one through-plating region and at least one mounting region, the through-plating regions each penetrate the mounting carrier and the mounting regions project beyond the casting body, and the metallizations each start from at least one of the through-plating regions and extend directly onto the casting body laterally next to the at least one associated through-plating region.

I further provide a method of manufacturing optoelectronic semiconductor components, including the following steps in order: A) providing a carrier composite in which a plurality of the mounting carriers are combined, the casting body extending contiguously over all of the mounting carriers of the carrier composite, B) applying the optoelectronic semiconductor chips so that each of the mounting carriers is provided with at least one optoelectronic semiconductor chip, and D) dividing the carrier composite to form the semiconductor components.

BRIEF DESCRIPTION OF THE DRAWINGS

FIGS. 12 to 17 show schematic sectional views of examples of optoelectronic semiconductor components.

FIGS. 18 and 20 show schematic sectional views of examples of mounting carriers for optoelectronic semiconductor components.

FIGS. 21 to 26 show schematic plan views of steps of an example of my method of manufacturing optoelectronic semiconductor components.

FIGS. 36 to 42 show schematic sectional views of examples of optoelectronic semiconductor components.

Figure 1:
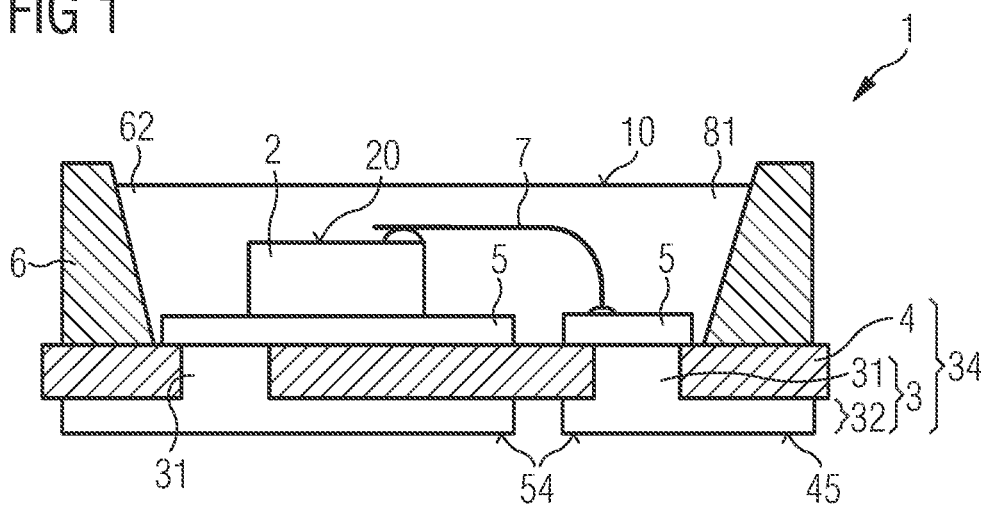
FIG. 1 shows a schematic sectional view of an example of my optoelectronic semiconductor component.
Figure 2:
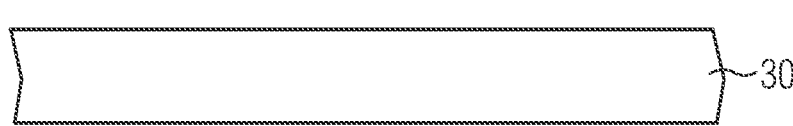
FIGS. 2 to 7 show schematic sectional views of steps of an example of my method of manufacturing optoelectronic semiconductor components.

REFERENCES 1 optoelectronic semiconductor component
10 upper surface of the semiconductor component
2 optoelectronic semiconductor chip
20 chip main side
28 drive chip
3 lead frame part
30 metal sheet
31 through-plating region
32 mounting region
33 conductor track
34 mounting carrier
35 conductor track crossing
36 trench
37 double trench
38 countersink
39 solder stop ring
4 casting body
45 contacting side of the semiconductor component
5 metallization
50 raw material layer
51 growth layer
52 main layer
53 conductor track
54 electrical connection surface
6 molded body
62 trough
7 bonding wire
81 cover body
82 metal ring
83 phosphor body
9 carrier composite
91 component field
92 connecting web
93 column contact
94 row contact
95 singulation lane
96 connecting bar

DETAILED DESCRIPTION

My semiconductor component may comprise one or more optoelectronic semiconductor chips. The at least one optoelectronic semiconductor chip is, for example, a light-emitting diode, abbreviated as LED, or a laser diode, abbreviated as LD. Likewise, the at least one optoelectronic semiconductor chip may be a photosensor, for example, for light intensity and/or for a light color. If several of the optoelectronic semiconductor chips are present, they may all be identical in construction or several different types of optoelectronic semiconductor chips may be installed. Thus, different optoelectronic semiconductor chips that generate light of different colors and/or sensor chips can be present in combination with each other.

The at least one optoelectronic semiconductor chip may have a contiguous radiation-emitting or radiation-sensitive region, as seen in plan view, or the at least one optoelectronic semiconductor chip is structured and comprises a plurality of electrically individually controllable radiation-emitting or radiation-sensitive regions. In other words, the at least one optoelectronic semiconductor chip may be pix-elated.

Preferably, the at least one optoelectronic semiconductor chip comprises a semiconductor layer sequence. The semiconductor layer sequence has at least one active region configured to generate radiation during operation of the light-emitting diode chip. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-x-m}Ga_mAs$ or such as $Al_nGa_mIn_{z-n-m}As_kP_{1-k}$, where in each case $0 \leq n \leq 1$, $0 \leq m \leq 1$ and $n+m \leq 1$ as well as $0 \leq k < 1$. The semiconductor layer sequence may include dopants as well as additional constituents. For the sake of simplicity, however, only the essential constituents of the crystal lattice of the semiconductor layer sequence, i.e. Al, As, Ga, In, N or P, are indicated, even if they may be partially replaced and/or supplemented by small amounts of additional substances.

The semiconductor component may comprise a plurality of lead frame parts. The lead frame parts are preferably formed from a metal sheet, for example, by etching, stamping and/or cutting. In particular, the lead frame parts are made of a copper sheet and thus of copper or a copper alloy. In particular, metallic coatings may be present on the lead frame parts, for example, to improve reflectivity or electrical contactability.

The semiconductor component may comprise a casting body. The casting body mechanically connects the lead frame parts to one another so that a mounting carrier is formed. The at least one optoelectronic semiconductor chip is then mounted on the mounting carrier. For example, the casting body is made of a plastic such as an epoxy. In particular, the casting body is light-impermeable, for example, black. It is possible that the casting body has a fiber reinforcement.

The semiconductor component may comprise a plurality of metallizations. The metallizations are preferably all of the same structure, i.e. in particular have the same layer sequence and/or are of the same thickness. The metallizations are different from the lead frame parts.

The lead frame parts may each comprise a through-plating region. The through-plating regions are each an integral part of the associated lead frame part. For example, the through-plating regions are thicker than other regions of the respective lead frame parts.

The through-plating regions may each penetrate the mounting carrier. This means that, seen in plan view of the mounting carrier, no material or no significant amount of material of the casting body is present in areas with the through-plating regions.

Some or all of the metallizations may each start from one or more of the through-plating regions. This means that the respective metallizations touch the respective at least one associated through-plating region and are electrically connected to this through-plating region. It is possible that at least one metallization is present which has no electrical function and which thus need not be connected to one of the through-plating regions.

Some or all of the metallizations may extend directly onto the casting body. This means that the respective metallizations cover the casting body laterally next to the at least one associated through-plating region. In particular, the metallizations are applied directly to the casting body in places. Preferably, the metallizations are applied exclusively to the casting body together with the through-plating regions.

The optoelectronic semiconductor component may comprise at least one optoelectronic semiconductor chip, a plurality of lead frame parts, and a casting body that mechanically connects the lead frame parts to one another so that a mounting carrier is formed on which the at least one optoelectronic semiconductor chip is mounted, wherein the lead frame parts each comprise a through-plating region and the through-plating regions each penetrate the mounting carrier.

The optoelectronic semiconductor component is thus based on a lead frame. In the semiconductor component, a variety of design elements can be efficiently combined with each other to efficiently design the semiconductor component.

The packages of many electronic and electro-optical components are based on a lead frame made of semi-etched copper. Such packages are, for example, QFN packages, where QFN stands for Quad Flat No leads. In the production of such packages or substrates, the lead frame is structured by etching in a first step and then cast in a casting material, also known as a mold compound. The casting material for the casting body is, for example, an epoxy with inorganic fillers, for example, to adjust a coefficient of thermal expansion.

As a result of this process, all copper parts in this lead frame composite are mechanically and thus also electrically connected to each other. This means, among other things:

1) There can be no electrically isolated areas in the lead frame composite. An electrical test of components in the composite is therefore only possible after mechanical separation, for example, by selective cutting to form individual areas, or the components can only be electrically tested after singulation.

2) No crossing of electrical potentials or current paths is possible in the component.

3) A design transfer of substrates such as printed circuit boards (PCBs) or ceramic-based substrates, is generally not possible.

The optoelectronic semiconductor component can overcome these restrictions.

The mounting carrier is manufactured in particular by casting and grinding. The mounting carrier can be further processed by transfer molding and also by other manufacturing processes, and other package materials besides black material for the casting body can be used in combination, in particular white epoxy materials or silicones, which can be applied specifically by techniques such as compression molding or injection molding. Such materials may contain luminescent materials for light conversion and/or optical filter materials, or may be designed as clear encapsulants. Semiconductor chips such as LEDs, lasers, detectors or ASICs can be applied to the mounting carrier not only by bonding, but also by AuSn soldering, Pb soldering or sintering.

Exemplary design elements for the semiconductor component, individually or in any combination with each other, include:

1) cavities for LED chips, detector chips or laser diodes, for example, created by molding, gluing on a frame or dam dispensing;
2) the optoelectronic semiconductor chip can be exposed, also referred to as exposed die molding, in particular producible by means of film-assisted molding, FAM for short;
3) use of the mounting carrier as an open package, i.e. without covering the optoelectronic semiconductor chip;
4) more than one optoelectronic semiconductor chip, also referred to as a multi-chip package;
5) application of an optical element, for example, a lens, for example, by bonding, compression molding or dispensing, in particular with the aid of corresponding structures on the mounting carrier;
6) rewiring instead of simply leading out electrical contacts, also referred to as fan-out, for example, by crossing current paths by insulating areas on a solder side and/or on a side with the optoelectronic semiconductor chip, for example, by solder resist, or by making an electrical connection under a cavity wall;
7) structures that reduce warpage of the mounting carrier, also referred to as anti-warpage structures, in particular in the carrier composite, for example, by matching metallic surfaces on the main sides of the carrier composite or by mechanically decoupling different areas of the carrier composite with carrier bodies;
8) adhesive creep stop structures;
9) limitation of clamping forces and of overflow of mold material, in particular in transfer molding, especially in an FAM, by structures on the mounting carrier, also referred to as mold flash stop and bleed stop implemented, for example, by solder stop structures or by circumferential trenches;
10) solder creep stop structures on the mounting carrier, for example, in the form of trenches or countersinks, also referred to as dimple holes; such structures can be present on a contacting side of the mounting carrier and/or on a side with the optoelectronic semiconductor chip and are located in particular next to the electrical connection surfaces, next to the semiconductor chips or next to the areas for a wire bond connection, for example, designed as a circumferential trench, or under the chips, for example, as a dimple hole or as a short trench; and/or
11) anchoring structures, for example, for a molded body or for a gate area in transfer molding; such anchoring structures are designed, for example, as etchings such as trenches, dimple holes or slots, or are also formed by a structured solder resist layer.

These design elements in particular enable the use of mounting carriers described here as substrates for the optoelectronic semiconductor components. This opens up great design freedoms and in many instances enables the design transfer from ceramic substrates or PCB substrates to lead frame based packages. Advantages of such packages include: designs with rewiring are possible, and thus the integration of an ASIC; high processing temperatures are possible, enabling, for example, Ag sintering or AuSn soldering, especially with a heated bond head (HBH), also known as HBH die attach;

low component tolerances are achievable;

the mounting carrier is suitable for transfer molding and compression molding; and a cost reduction is achievable.

Thus, depending on the specific source design and target design, advantages of a design transfer from PCBs and multilayer ceramics include:

significant cost savings;

higher thermal conductivity and lower thermal resistance, increased reliability of solder joints and electrical wiring, and smaller component tolerances.

The optoelectronic semiconductor component may further comprise a molded body. The molded body is preferably made of a light-impermeable material, for example, a white material such as a white epoxy. The molded body is mounted on the mounting carrier, in particular irreversibly. In particular, the molded body and the casting body are made of different materials. For example, the molded body is bonded to the mounting carrier or created on the mounting carrier by injection molding and/or compression molding.

The molded body may run all around the at least one optoelectronic semiconductor chip. This means that, seen in plan view of a chip main side, the molded body forms a frame around the at least one optoelectronic semiconductor chip. In this example, the chip main side is a main side of the optoelectronic semiconductor chip facing away from the mounting carrier. The molded body preferably leaves the chip main side partially or completely exposed. Furthermore, the molded body is preferably arranged spaced apart from the optoelectronic semiconductor chip so that the molded body and the optoelectronic semiconductor chip do not touch.

A trough for the at least one optoelectronic semiconductor chip may be formed by the molded body together with the mounting carrier. The trough may be designed as a reflector trough and may widen in the direction away from the mounting carrier. In particular, the trough is designed as a truncated cone opening or truncated pyramid opening.

The optoelectronic semiconductor component may further comprise electrical connection surfaces for external electrical contacting of the semiconductor component. The connection surfaces are located on a main side of the mounting carrier, which is opposite a main side with the at least one optoelectronic semiconductor chip. In particular, the semiconductor component can be SMT-contacted on the side with the connection surfaces.

The connection surfaces may be formed by mounting regions of the lead frame parts or alternatively by the metallizations. The mounting regions and the at least one associated through-plating region are each formed in one piece. In other words, the lead frame parts may each consist of the mounting region and the at least one associated through-plating region. The areas of the mounting regions projecting beyond the through-plating regions are produced in particular by half-etching the lead frame, in particular from one side. This means that the mounting regions may comprise thinned areas of the lead frame.

In particular, the mounting regions are those areas of the respective lead frame that protrude beyond the casting body in the direction away from the contacting side of the semiconductor component.

The mounting regions may each be as large as or, preferably, larger than the at least one associated through-plating region. This means that the respective mounting regions laterally protrude beyond the through-plating regions. This applies in particular as seen in plan view of the contacting side of the semiconductor component. The contacting side is configured for external electrical connection of the connection surfaces, in particular by SMT, for Surface Mount Technology.

The mounting regions and the respectively associated metallizations may be arranged congruently one above the other at the connection surfaces, as seen in plan view of the contacting side. This means that the same pattern of metal areas results on both main sides of the mounting carrier with regard to the connection surfaces. This can reduce bending of the mounting carrier due to temperature changes, for example, as the metal areas on the main sides balance each other out and stabilize the mounting carrier.

The at least one optoelectronic semiconductor chip may be mounted on one of the lead frame parts, preferably on a largest one of the lead frame parts. This lead frame part constitutes, for example, at least 20% or at least 50% or at least 70% of a total area of all lead frame parts taken together. This lead frame part may serve as a heat sink.

A plurality of smaller lead frame parts may be arranged around the largest lead frame part. The smaller lead frame parts serve in particular as electrical contact surfaces.

The lead frame parts on a first main side of the mounting carrier and/or the metallizations on an opposite second main side of the mounting carrier may form at least one electrical conductor track. This means that, in particular in addition to the electrical connection surfaces, electrical conductor tracks may be present. Preferably, the lead frame parts and the metallizations are formed integrally with the associated conductor tracks.

Some or all of the lead frame parts and/or the metallizations for the connection surfaces may be provided with the conductor tracks. This means that preferably each connection surface, or each connection surface except for the connection surface associated with the largest lead frame part, is provided with at least one conductor track.

At least one bonding wire may be mounted on each of some or all of the conductor tracks. The bonding wire leads to another conductor track, to another connection surface and/or to the at least one optoelectronic semiconductor chip.

The optoelectronic semiconductor component may comprise a plurality of the conductor tracks. At least two of the conductor tracks cross each other, in particular as seen in plan view of the first main side. Preferably, the casting body is located between crossing conductor paths.

Some or all of the metallizations may have a base area that is larger by at least a factor of 1.5 or at least a factor of two or at least a factor of three than the at least one associated through-plating region. This applies in particular as seen in plan view of the respective main side of the mounting carrier. The base areas preferably include the connection surfaces as well as the conductor tracks assigned to the at least one respective through-plating region. Thus, efficient wiring and current routing can be achieved by the metallizations.

One, several or all of the lead frame parts may have: a trench or double trench running around the at least one optoelectronic semiconductor chip, a countersink on or under the at least one optoelectronic semiconductor chip, a solder stop ring running around the at least one optoelectronic semiconductor chip, and/or an electrically non-functional metal ring running around the at least one optoelectronic semiconductor chip. By such trenches, countersinks or rings, anchoring structures and/or overflow protection structures can be realized on the mounting carrier.

The casting body may form a plane-parallel plate which is penetrated by the through-plating regions and to which the metallizations are applied. Both the metallizations and the mounting regions of the lead frame parts thus rise above the casting body and above this plane-parallel plate.

The optoelectronic semiconductor component may comprise one or more cover bodies. The at least one cover body is applied to the mounting carrier. Preferably, the cover body touches the at least one optoelectronic semiconductor chip.

The cover body may be permeable to radiation to be generated and/or received by the at least one optoelectronic semiconductor chip. In particular, the cover body is light-permeable if the semiconductor chip is configured for visible light and/or permeable to near-infrared radiation, for example, if the semiconductor chip is configured for near-infrared radiation. The cover body may partially or completely cover the at least one optoelectronic semiconductor chip. For example, the cover body is an optical element such as a lens. Alternatively, the cover body may partially or completely absorb the relevant radiation and may be a phosphor body and/or an optical filter. If the semiconductor chip is configured for near-infrared radiation, the cover body may be a daylight filter and thus be impermeable to visible light.

The at least one optoelectronic semiconductor chip may form part of an external upper surface of the semiconductor component. Thus, the optoelectronic semiconductor chip can protrude beyond or be flush with the mounting carrier, the molded body and the cover body, in particular in the direction away from the contacting side.

The metallization may have a multilayer structure. In particular, the metallization comprises a relatively thin growth layer and a main layer that is thick in relation to the growth layer. The growth layer is produced by sputtering, for example, and the main layer is preferably an electroplating layer. The main layer is preferably thicker than the growth layer by at least a factor of 100. In particular, a thickness of the main layer is at least 10 μm or at least 300 μm and/or at most 0.5 mm or at most 0.1 mm, in particular 300 μm to 500 μm. The growth layer and the main layer can be made of the same material, preferably copper.

The semiconductor component may further comprise at least one drive chip for the at least one optoelectronic semiconductor chip. The at least one drive chip is electrically connected to the at least one optoelectronic semiconductor chip. The drive chip is in particular an ASIC, i.e. an application-specific integrated circuit. It is possible that the drive chip is not visible from outside the semiconductor component.

The molded body may form a plurality of troughs. The optoelectronic semiconductor chips are distributed among the troughs. It is possible that individual troughs remain free of the at least one optoelectronic semiconductor chip. A plurality of the optoelectronic semiconductor chips may be disposed in at least one trough.

Side surfaces of the semiconductor component may be free of the lead frame parts. This means, for example, that the lead frame parts end inside the mounting carrier as seen in plan view of the contacting side, i.e. do not extend to an edge of the mounting carrier. Alternatively or additionally, this means that, seen in side view of the mounting carrier, i.e. seen perpendicular to the contacting side, the lead frame parts are covered and thus not visible. This preferably applies on the contacting side, but can also apply in the same way on a main side of the mounting carrier opposite the contacting side. For example, viewed from the side of the semiconductor component, the lead frame parts are covered by the casting body, optionally together with the molded body, preferably at least on the contacting side. It is possible that side surfaces of the through-plating regions are completely covered by the casting body.

The mounting regions and/or the through-plating regions may be partially or completely provided with a coating, especially with a metallic coating, at least outside the casting body. This coating preferably has a wetting effect for solders such as AuSn solders. This means that, in particular on the contacting side, the lead frame parts can be configured to be wetted over their entire surface by a solder due to the coating. Since the lead frame parts preferably do not extend to an edge of the contacting side, a solder on the lead frame parts also preferably does not extend to the edge of the contacting side. The coating can be single-layered or multilayered.

At least one further lead frame part may be present in addition to the lead frame parts composed of the through-plating regions and the mounting regions. The at least one further lead frame part is formed, for example, only from a mounting region and can thus be free of a through-plating region. The at least one further lead frame part is thus preferably thinner than the lead frame parts and/or does not extend through the casting body.

It is possible for the further lead frame part or parts to be electrically non-functional or alternatively to have an electrical function, for example to form a conductor track. Electrically non-functional and electrically functionalized further lead frame parts can be combined in the same semiconductor component.

At least one further metallization may be present in addition to the metallizations. The at least one further metallization is in particular applied to the casting body spaced apart from the lead frame parts and/or spaced apart from the further lead frame parts. Electrically non-functional and/or electrically functionalized further metallizations can be present in the same semiconductor component and electrically non-functional and electrically functionalized further metallizations can also be combined with one another.

In particular, it is possible to use the further lead frame parts to implement an electrical interconnection with crossing conductor tracks. Crossing conductor tracks can also be realized by a combination of the metallizations and the lead frame parts as well as the optional further metallizations and/or the optional further lead frame parts.

The metallizations may extend widely onto the casting body, starting from the associated lead frame part or further lead frame part. For example, an extension of the respective metallization onto the casting body is at least a double or a quintuple or a tenfold or a twentyfold of a thickness of the respective metallization. This means that a lateral protrusion of the respective metallization beyond the associated lead frame part directly onto the casting body is significantly greater than the thickness of this metallization. This thickness is preferably determined in the direction perpendicular to the contacting side.

The metallizations and/or the further metallizations may be built up in multiple layers directly on the casting body. For example, at least two metal layers or at least three metal layers per metallization and/or further metallization are present. Single-layer and multilayer metallizations may be combined with each other in the same semiconductor component.

The semiconductor component may be free of tie bars extending from the lead frame parts. Tie bars are usually used to connect adjacent lead frame parts, in particular in a carrier composite. Since the lead frame parts described here do not have such tie bars, the side surfaces of the semiconductor component can be free of interfaces through such tie bars. This means that the side surfaces can be formed entirely by non-metallic materials and/or the lead frame parts are electrically insulated from the side surfaces.

In addition, I provide a method of manufacturing an optoelectronic semiconductor component as described in connection with one or more of the above examples. Features of the optoelectronic semiconductor component are therefore also disclosed for the method, and vice versa.

The method may manufacture optoelectronic semiconductor components and comprise, preferably in the order indicated:

A) providing a carrier composite in which a plurality of the mounting carriers are combined, the casting body extending contiguously over all of the mounting carriers of the carrier composite, B) applying the optoelectronic semiconductor chips so that each of the mounting carriers is provided with at least one optoelectronic semiconductor chip, and D) dividing the carrier composite to form the semiconductor components.

The method may comprise in particular between steps B) and D):

C) testing the optoelectronic semiconductor chips in the carrier composite, the optoelectronic semiconductor chips being individually electrically driven.

The testing in step C) may comprise one or more of:

C1) determining first color locations of emissions of the optoelectronic semiconductor chips still without phosphor bodies, C2) determining second color locations of emissions of the optoelectronic semiconductor chips during a creation of the phosphor bodies so that a phosphor quantity can still be corrected during the creation of the phosphor bodies, and C3) determining third color locations of emissions of the optoelectronic semiconductor chips with the finished phosphor bodies. Step C3) can occur before, during, or after step D) to selectively remove specific semiconductor components with a specific emission color location range from the carrier composite. In other words, binning can take place as part of the singulation process.

Step A) may comprise:

A1) etching a metal sheet from one side, the metal sheet remaining a mechanical unit and the through-plating regions being formed, and/or A2) producing the casting body on the etched metal sheet by casting, compression molding or injection molding, and/or A3) grinding the casting body so that the through-plating regions are exposed from excess material of the casting body.

Optionally, step A) further comprises:

A4) applying the metallic coating to the lead frame parts such that preferably all externally exposed areas of the lead frame parts are provided with the metallic coating.

The carrier composite may comprise, up to step D), a plurality of component fields spaced apart from one another. The mounting carriers are arranged close to one another in the component fields. Areas between adjacent component fields are preferably free of mounting carriers.

Adjacent component fields may be connected to one another by metallic connecting webs located on the contiguous casting body. This means that the connecting webs bridge the areas between the adjacent component fields. Preferably, the connecting webs are formed by the lead frame parts and the metallizations. This means that the connecting webs mechanically reinforce the casting body between the adjacent component fields. In the finished semiconductor components, the connecting webs are preferably no longer present.

The connecting webs may have at least one branch and/or at least one meander. This means that, seen in plan view, the connecting webs can be kinked, twisted and/or branched. This allows adjacent component fields to be mechanically decoupled since the connecting webs are not completely rigid but can have a structure similar to a spring.

In the following, an optoelectronic semiconductor component described herein and a method described herein will be explained in more detail with reference to the drawings on the basis of examples. Identical reference signs indicate identical elements in the individual figures. However, no scaled representation is shown; rather, individual elements may be shown exaggeratedly large for better understanding.

FIG. 1 shows an example of an optoelectronic semiconductor component 1. The semiconductor component 1 comprises a mounting carrier 34. The mounting carrier 34 is composed of a central casting body 4, of lead frame parts 3 and of metallizations 5. The lead frame parts 3 each consist of a through-plating region 31 and a mounting region 32. The mounting regions 32 and the metallizations 5 each project beyond the casting body 4. The casting body 4 together with the through-plating regions 31 constitutes a plane-parallel body.

An optoelectronic semiconductor chip 2 with a chip top side 20 is mounted on the mounting carrier 34. Electrical contact is made on the one hand directly via one of the metallizations 5 and on the other hand via a bonding wire 7 to another one of the metallizations 5.

The metallizations 5 each start directly from the associated through-plating region 31 and also cover the casting body 4. When viewed from a contacting side 45 of the semiconductor component 1, the metallizations 5 and the associated mounting regions 32 may be approximately equal in size.

According to FIG. 1, the lead frame parts 3 form electrical connection surfaces 54 for SMT contacting of the semiconductor component 1, as in the other figures. However, in all other examples, the metallizations 5 can alternatively form the connection surfaces 54, so that the lead frame parts 3 and the metallizations 5 can assume interchanged positions.

Preferably, a molded body 6 is applied to the mounting carrier 34, for example, by injection molding. The molded body 6 is preferably made of a white material, whereas the casting body 4 is in particular made of a black epoxy. The molded body 6 forms a trough 62 in which the semiconductor chip 2, which is in particular an LED chip, is located.

The trough 62 is optionally partially or completely filled with a cover body 81, for example, a transparent silicone. The cover body 81 completely covers the semiconductor chip 2 and embeds the bonding wire 7. A part of an upper surface 10 of the semiconductor component 1 is formed by the cover body 81.

By having both lead frame parts 3 and metallizations 5, the QFN semiconductor component 1 can be efficiently designed.

FIGS. 2 to 7 illustrate a method of manufacturing the mounting carrier 34 as it may be used in FIG. 1. According to FIG. 2, a metal sheet 30, for example made of a copper alloy, is provided.

Figure 3:

According to FIG. 3, the metal sheet 30 is preferably half etched from only one side so that the mounting regions 32 are formed. The through-plating regions 31 are essentially unaffected by the etching.

Figure 4:
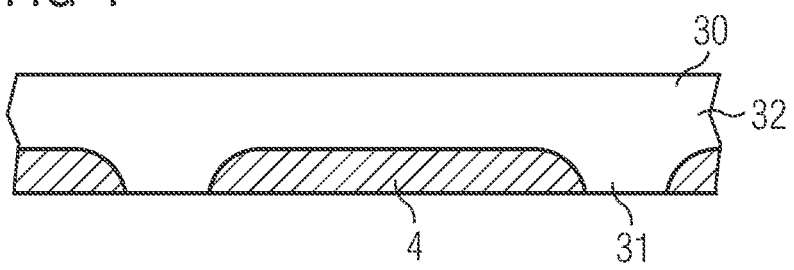

FIG. 4 illustrates that the casting body 4 is produced. Preferably, a starting material for the casting body 4 is poured into the etched metal sheet 30 and subsequently excess material is removed, for example, by grinding so that the through-plating regions 31 are exposed. The casting body 4 is thus molded directly onto the metal sheet 30 and is finally flush with the through-plating regions 31.

Figure 5:
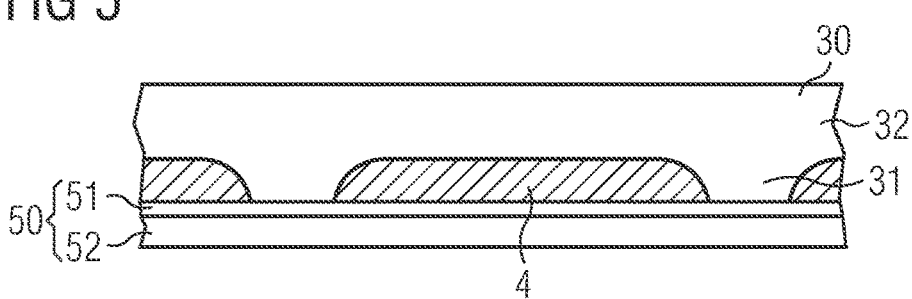

In the optional step shown in FIG. 5, a raw material layer 50 is produced for the metallizations 5. Preferably, a thin growth layer 51 is first formed by sputtering, onto which a significantly thicker main layer 52 is electroplated. The raw material layer 50 can be produced as a contiguous, unstructured layer directly on the casting body 4 and directly on the through-plating regions 31. Alternatively, the raw material layer 50 can be applied as an already structured layer, for example, with the aid of a masking layer which is not shown.

Figure 6:
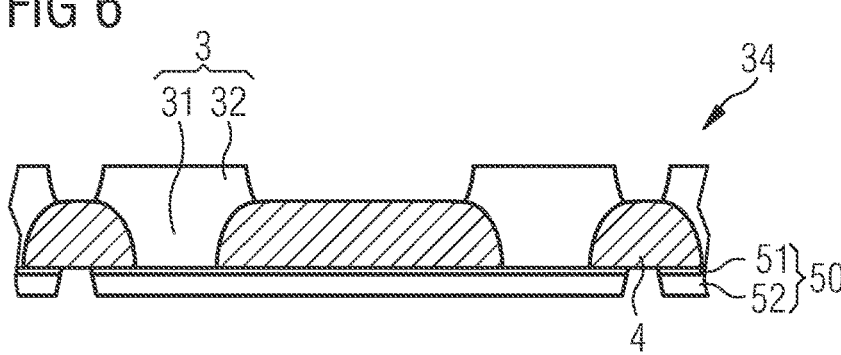

According to FIG. 6, the raw material layer 50 and the metal sheet 30 are structured, for example, by etching so that the mounting regions 32 and the metallizations 5 result.

Figure 7:
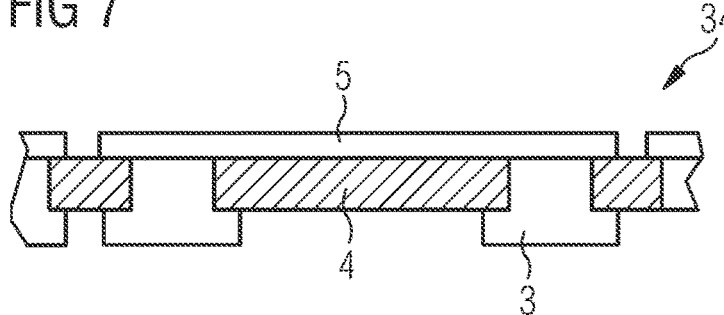

Due in particular to the etching process that produces the mounting regions 32 and the through-plating regions 31, these have curved side surfaces. To simplify the representation, these side surfaces are each drawn below as flat surfaces, see FIG. 7. This means that the representations of the lead frame parts 3 of FIGS. 6 and 7 are considered to be the same.

Deviating from the illustration in FIGS. 4 to 7, it is also possible that the casting body 4 is first produced on the metal sheet 30, that structuring then takes place in the mounting regions 32 and the through-plating regions 31, and that only then the raw material layer 50 is applied over the surface before it is structured to form the metallizations 5, whereupon the application of a metallic coating optionally takes place, not shown, and with the metallic coating, for example, soldering properties of the mounting carrier 34 can be improved.

Figure 8:
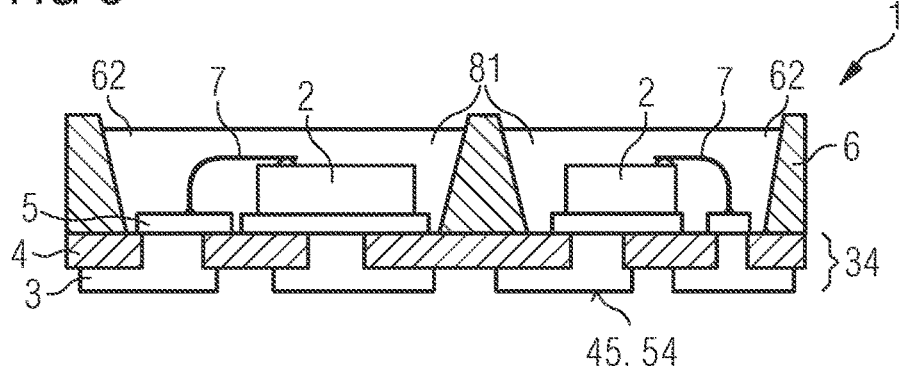
FIGS. 8 to 10 show schematic sectional views of examples of my optoelectronic semiconductor components.

In the example shown in FIG. 8, the molded body 6 forms two troughs 62. An optoelectronic semiconductor chip 2 is located in each of the troughs 62. In all other respects, the description of FIG. 1 applies equally to FIG. 8.

Figure 9:
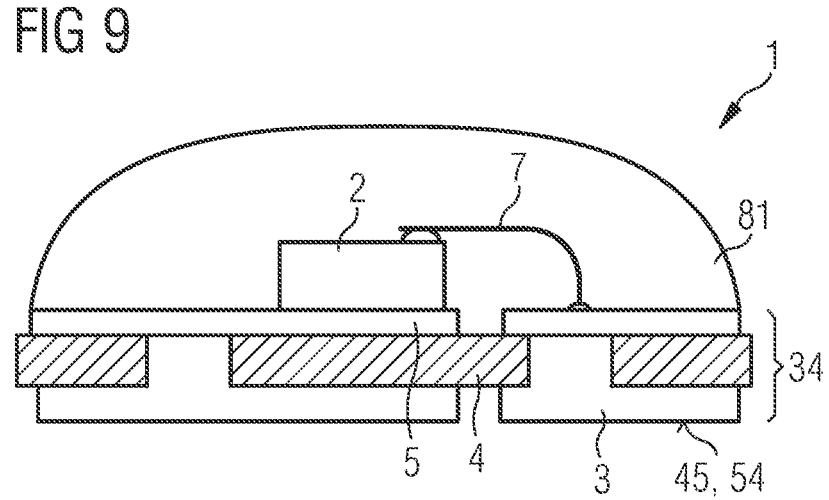

According to FIG. 9, the semiconductor component 1 comprises a cover body 81, but no molded body 6. The cover body 81 can completely cover the metallizations 5. For example, the cover body 81 is designed as a converging lens. The cover body 81 is made of a material transparent to the radiation to be emitted or received by the semiconductor chip 2, for example, a silicone. In all other respects, the description of FIGS. 1 to 8 applies equally to FIG. 9.

Figure 10:
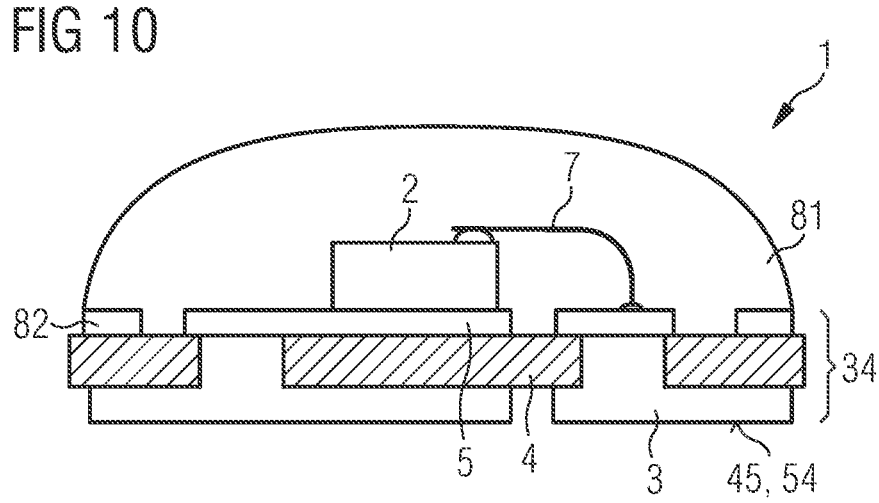
Figure 11:
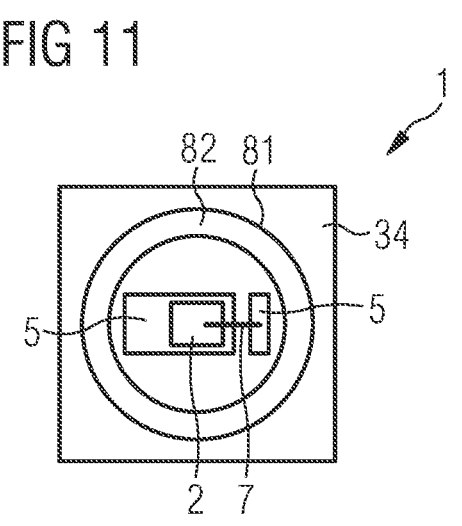
FIG. 11 shows a schematic plan view of the semiconductor component of FIG. 10.

In the example of FIGS. 10 and 11, the semiconductor component 1 also has a metal ring 82. The metal ring 82 has no electrical function, but defines a shape of the cover body 81. On the outside, the cover body 81 and the metal ring 82 are flush with each other. In all other respects, the description of FIG. 9 applies equally to FIGS. 10 and 11.

Figure 12:
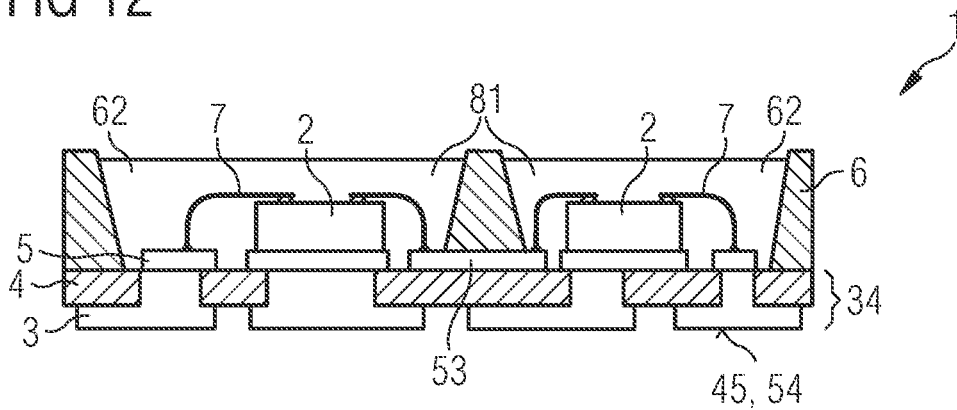

According to FIG. 12, a conductor track 53 formed by the metallization 5 runs on the same main side of the mounting carrier 34 on which the semiconductor chips 2 are mounted. The conductor track 53 extends under a partition wall between the troughs 62. By the conductor track 53, the semiconductor chips 2 are electrically connected in series.

In all other respects, the description of FIG. 8 applies equally to FIG. 12.

Figure 13:
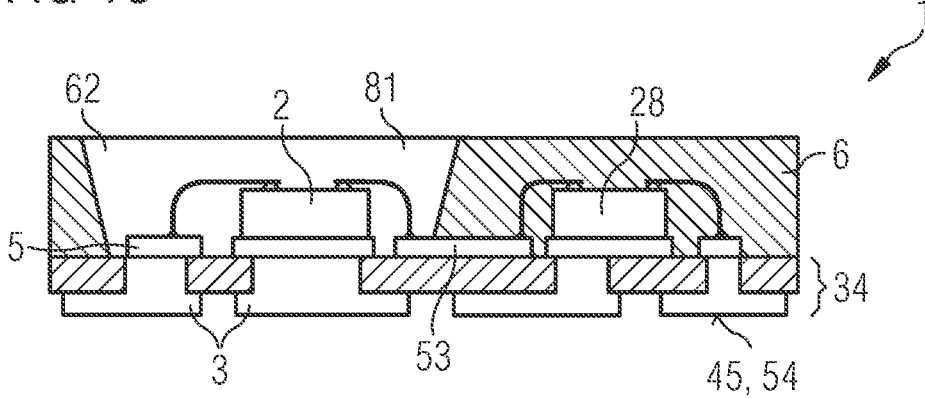

In the semiconductor component 1 of FIG. 13, in addition to the at least one optoelectronic semiconductor chip 2, at least one drive chip 28 is mounted on the mounting carrier 34. In this example, the drive chip 28 is completely covered by the molded body 6 and is thus embedded between the molded body 6 and the mounting carrier 34 so that it is not visible from outside the semiconductor component 1. A wiring between the drive chip 28 and the optoelectronic semiconductor chip 2 is realized by the at least one conductor track 53 of the metallization 5.

In all other respects, the description of FIG. 12 applies equally to FIG. 13.

Figure 14:
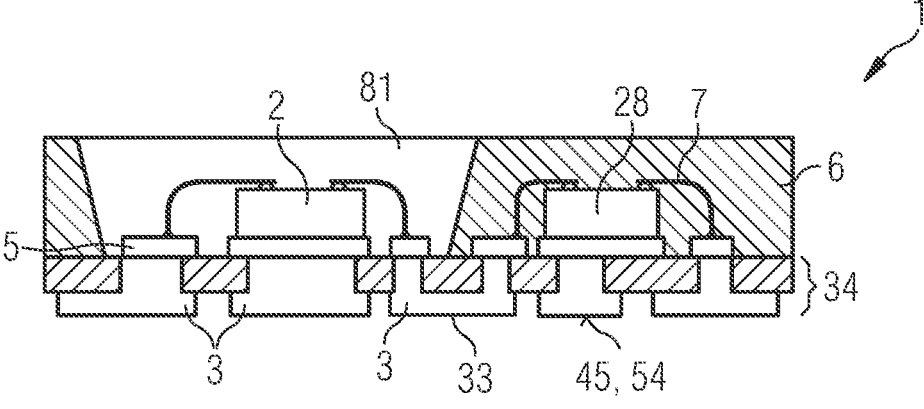

In FIG. 14, it is shown that the interconnection can also be made with a conductor track 33 on the contacting side 45. This conductor track 33 is accordingly formed from a lead frame part 3, which preferably comprises a mounting region 32 and two through-plating regions 31. Such lead-frame-based conductor tracks 33 can be used instead of metallization-based conductor tracks 53 in the same way in all other exemplary embodiments.

In all other respects, the description of FIG. 13 applies equally to FIG. 14.

FIGS. 15 to 17 illustrate semiconductor components 1 in which the at least one optoelectronic semiconductor chip 2 forms part of the upper surface 10 of the semiconductor component 1. According to FIG. 15, the semiconductor chip 2 protrudes over the optional molded body 6. In FIGS. 16 and 17, the semiconductor chip 2 is flush with the optional molded body 6. The molded body 6 is preferably white and made, for example, of a silicone to which light-scattering particles, in particular of titanium dioxide, are added.

As a further option, as in all other examples, the semiconductor components 1 may comprise a phosphor body 83. The phosphor body 83 preferably serves to partially or completely convert blue light or near-ultraviolet radiation from the semiconductor chip 2 into light of a different color, such as to provide a white light source.

According to FIG. 16, the phosphor body 83 can be applied congruently to the semiconductor chip 2. In this example, it is possible that not the semiconductor chip 2 but the phosphor body 83 is flush with the molded part 6. In contrast to this, the phosphor body 83 in FIG. 17 covers both the molded body 6 and the semiconductor chip 2. Furthermore, it is possible that a phosphor is added to the cover body 81, see for example, FIG. 1, 9, 12 or 13, not shown. All these configurations may also be realized in all other examples.

In all other respects, the description of FIGS. 1 to 14 applies equally to FIGS. 15 to 17.

FIG. 18 shows a sectional view of a part of the mounting carrier 34. On a first main side there are the metallizations 5 which form, among other things, two conductor tracks 53a, 53b. On a second main side are the lead frame parts 3 which form, among other things, two conductor tracks 33a, 33b. The conductor tracks 33a, 53a run perpendicular to the drawing plane, and the conductor tracks 33b, 53b run parallel to the drawing plane.

Thus, the conductor tracks 33b and 53a and the conductor tracks 33a and 53b cross each other. By using both the lead frame parts 3, composed of the through-plating regions 31 and the mounting regions 32, and the metallizations 5, it is thus possible to realize comparatively complex electrical circuits in the QFN semiconductor component 1 with the mounting carrier 34, as is otherwise only possible with multilayer circuit boards. Corresponding crossing conductor tracks can also be used in the examples of FIGS. 8, 12, 13 and/or 14 in particular.

Figure 19:
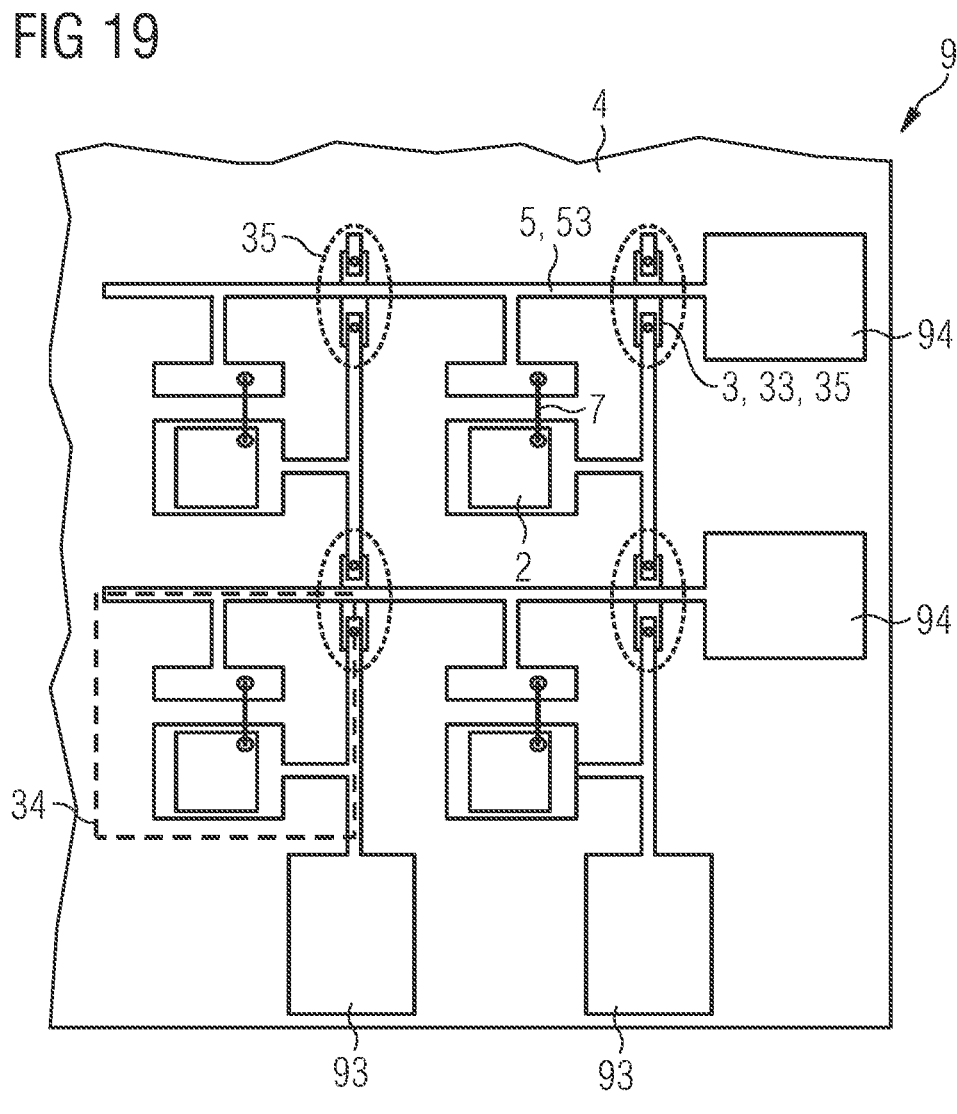
FIGS. 19 and 27 show schematic plan views of examples of carrier composites for optoelectronic semiconductor components.

FIG. 19 shows a carrier composite 9 comprising a plurality of mounting carriers 34 that are later singulated to form the semiconductor components 1. For each mounting carrier 34, at least one optoelectronic semiconductor chip 2 is mounted on metallizations 5 on the casting body 4.

Column contacts 93 and row contacts 94 are located laterally next to the mounting carriers 34.

Due to conductor track crossings 35, the semiconductor chips 2 can be electrically controlled individually via the column contacts 93 and row contacts 94 and can thus be tested. Thus, a kind of matrix circuit is formed. The column contacts 93 and row contacts 94 are no longer present in the finished semiconductor components 1 and are thus disconnected. Such column contacts 93 and row contacts 94 can also be used in the manufacturing method of FIGS. 2 to 7.

Figure 20:
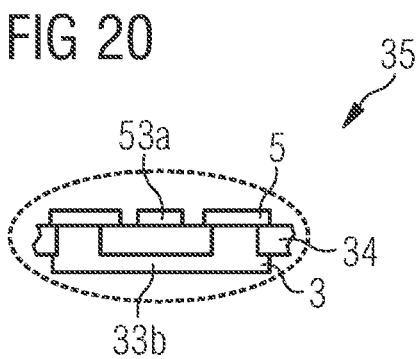

Examples of conductor track crossings 35, as used in FIG. 19, are shown in FIG. 20. The conductor track 53a on the side of the metallization 5 runs perpendicular to the drawing plane, and the conductor track 33b, which is realized from a lead frame part 3, runs parallel to the drawing plane of FIG. 20.

FIGS. 21 to 26 illustrate a further manufacturing method for the semiconductor components 1. In this method, column contacts 93 and row contacts 94 as well as conductor track crossings 35 are preferably used, as explained in connection with FIGS. 18 to 20.

Figures 21, 22, 23, 24, 25, 26:
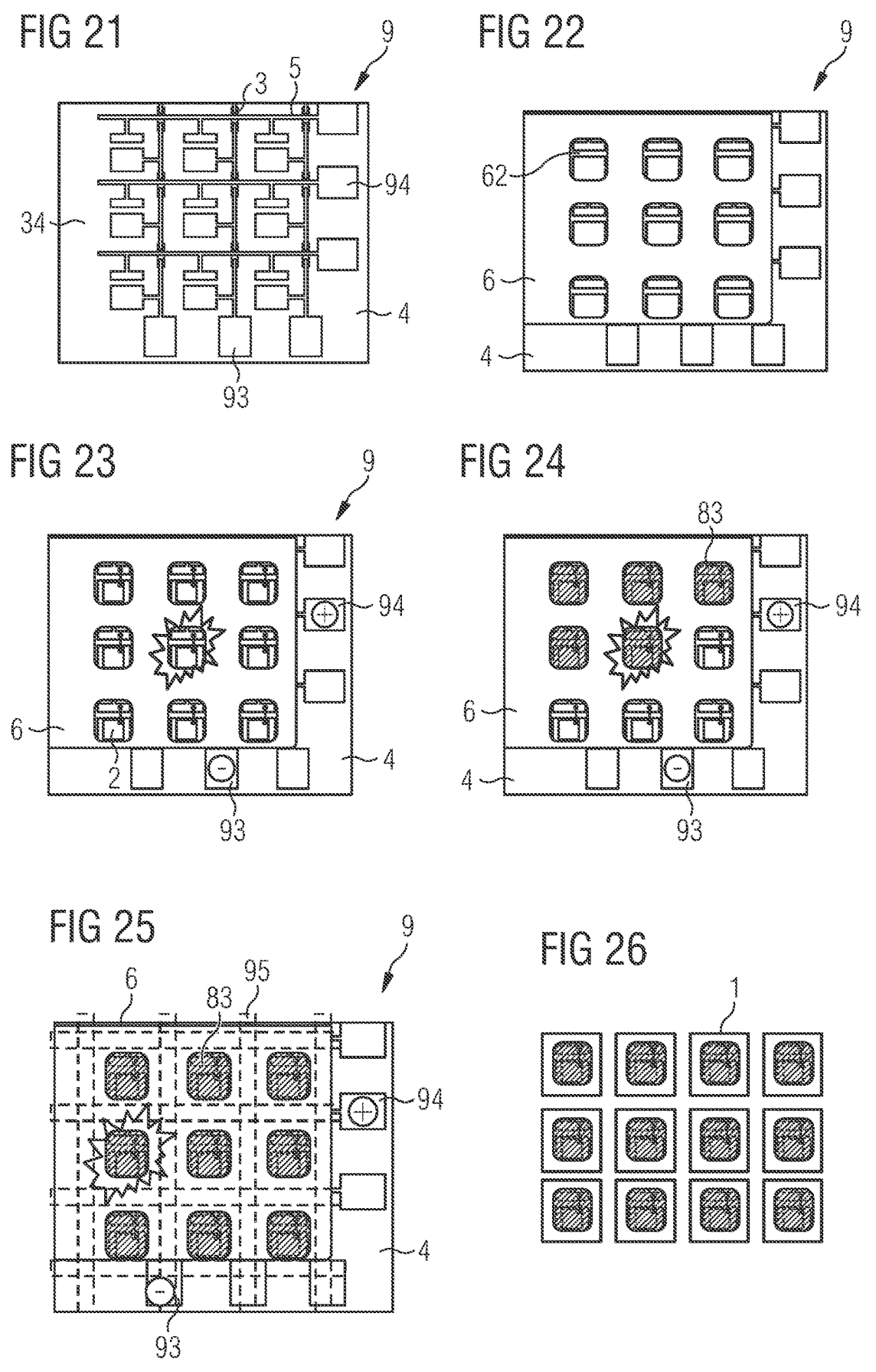

In FIG. 21, it can be seen that the carrier composite 9 is provided with the mounting carriers 34, which include metallizations 5 and the lead frame parts 3. In FIG. 22, the molded body 6 is created, extending contiguously over all the mounting carriers 34 and leaving areas for the semiconductor chips 2.

According to FIG. 23, the semiconductor chips 2 are applied, for example, glued on, and electrically contacted with the bonding wires 7. It is possible to operate the semiconductor chips 2 individually via the column contacts 93 and row contacts 94 and to determine first color locations of emissions of the semiconductor chips 2, i.e. in particular to conduct a first binning.

Optionally, see also FIG. 24, the phosphor bodies 83 are applied to the semiconductor chips 2, wherein the phosphor bodies 83 may partially or completely fill the troughs 62. During the production of the phosphor bodies 83, it is optionally possible that the semiconductor chips 2 are operated again and the light emission is measured. In this way, it is possible to adjust the correct amount of phosphor during the production of the phosphor bodies 83.

In addition, see FIG. 25, further individual electro-optical testing of the semiconductor chips 2 with the finished phosphor bodies 83 can be carried out via the column contacts 93 and row contacts 94 to achieve final binning. The column contacts 93 and row contacts 94 are controlled, for example, by a needle card, not shown. By this third electro-optical testing, semiconductor components 1 with a specific emission color location range can subsequently be removed from the former carrier composite.

Furthermore, it is shown in FIG. 25 that singulation lanes 95 are present, which preferably run congruently with the conductor tracks for testing the semiconductor chips 2. Along the singulation lanes 95, the mounting carriers 34 and the molded body 6 of the carrier composite 9 are separated, for example by means of sawing. The resulting singulated semiconductor components 1 are illustrated in FIG. 26.

The method of FIGS. 21 to 26 can be combined with the method of FIGS. 2 to 7 and can be used for all examples of FIGS. 1 and 8 to 20.

Figure 27:
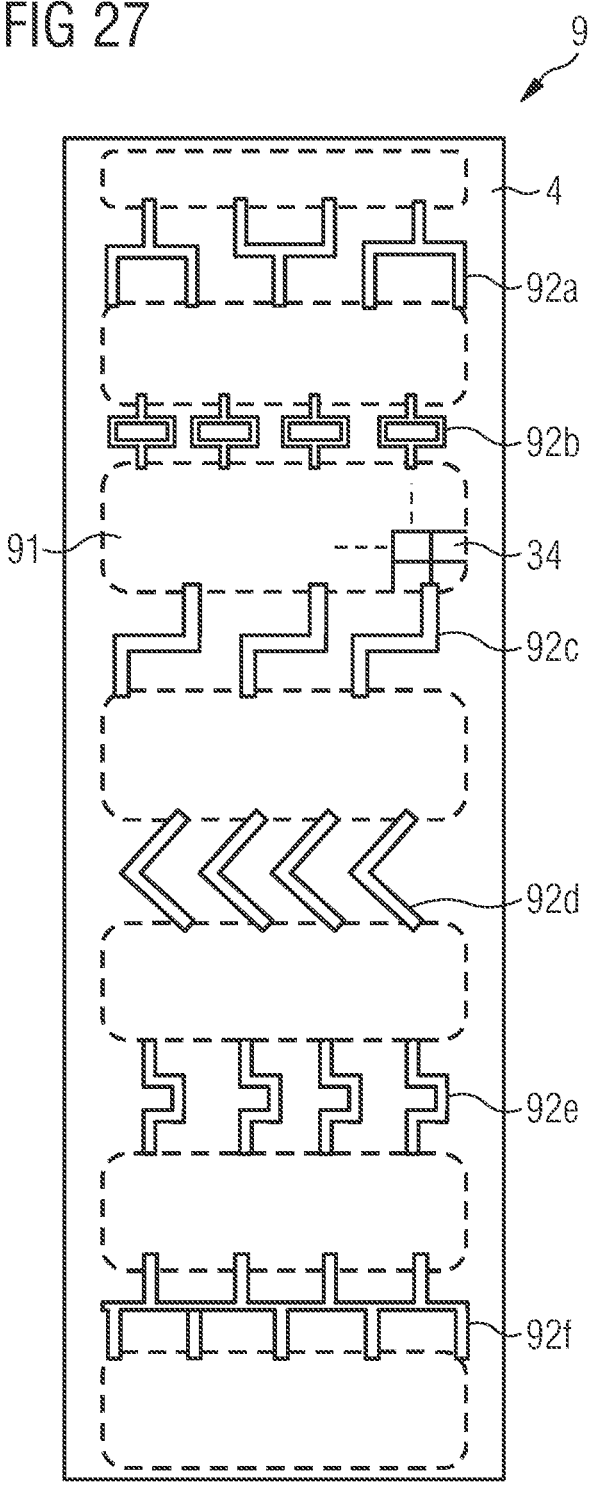

Another carrier composite 9 is illustrated in FIG. 27. The carrier composite 9 comprises several component fields 91, in which the mounting carriers 34 are preferably arranged close to one another, as illustrated for example in FIG. 19 or 21. There are no mounting carriers 34 between adjacent component fields 91, i.e. the areas between the component fields 91 are not intended for mounting semiconductor chips.

Between the component fields 91 there is thus the casting body 4, which is relatively thin, for example at least 50 μm and/or at most 0.3 mm. Therefore, additional connecting webs 92 are present in these areas. The connecting webs 92 are preferably attached to the casting body 4 on both sides and preferably also congruently and are thus realized as metallizations or lead frame parts. The casting body 4 is mechanically stabilized by the connecting webs 92 so that breakage of the carrier composite 9 between the component fields 91 is prevented.

To mechanically decouple adjacent component fields 91 from one another at least in part, the connecting webs 92 are preferably designed similar to springs. This allows mechanical stabilization to be achieved on the one hand and mechanical stresses between the component fields 91 to be absorbed on the other.

The connecting webs 92 are thus preferably branched or meandering as seen in plan view of the casting body 4. Preferably, several of the connecting webs 92 are present next to each other between the component fields 91. Examples of possible shapes for the connecting webs 92 are illustrated in FIG. 27.

In particular, the individual connecting webs 92*a* are Y-shaped, although right-angled kinks may be present. Alternatively, the connecting webs 92*b* are O-shaped with projections such that a closed area is centered in the connecting webs 92*b*. Further, the connecting webs 92*c* may have a plurality of right-angled or approximately right-angled kinks. Triangular sawtooth-shaped connecting webs 92*d* are also possible. Similarly, rectangular sawtooth-shaped connecting webs 92*e* may be employed. In addition, mesh-shaped connecting webs 92*f*, for example with rectangular mesh gaps or, differently from what is shown in the drawing, also with hexagonal or trigonal mesh gaps are possible.

The carrier composite 9 of FIG. 27 can also have column contacts and row contacts, not shown, analogous to FIGS. 19 and 21, for example. In all other respects, the description of FIGS. 1 to 26 applies equally to FIG. 27.

FIGS. 28 to 32 illustrate another example of the semiconductor component 1, focusing on the mounting carrier 34, in particular on the metallizations 5 and on the lead frame parts 3.

Figure 28:
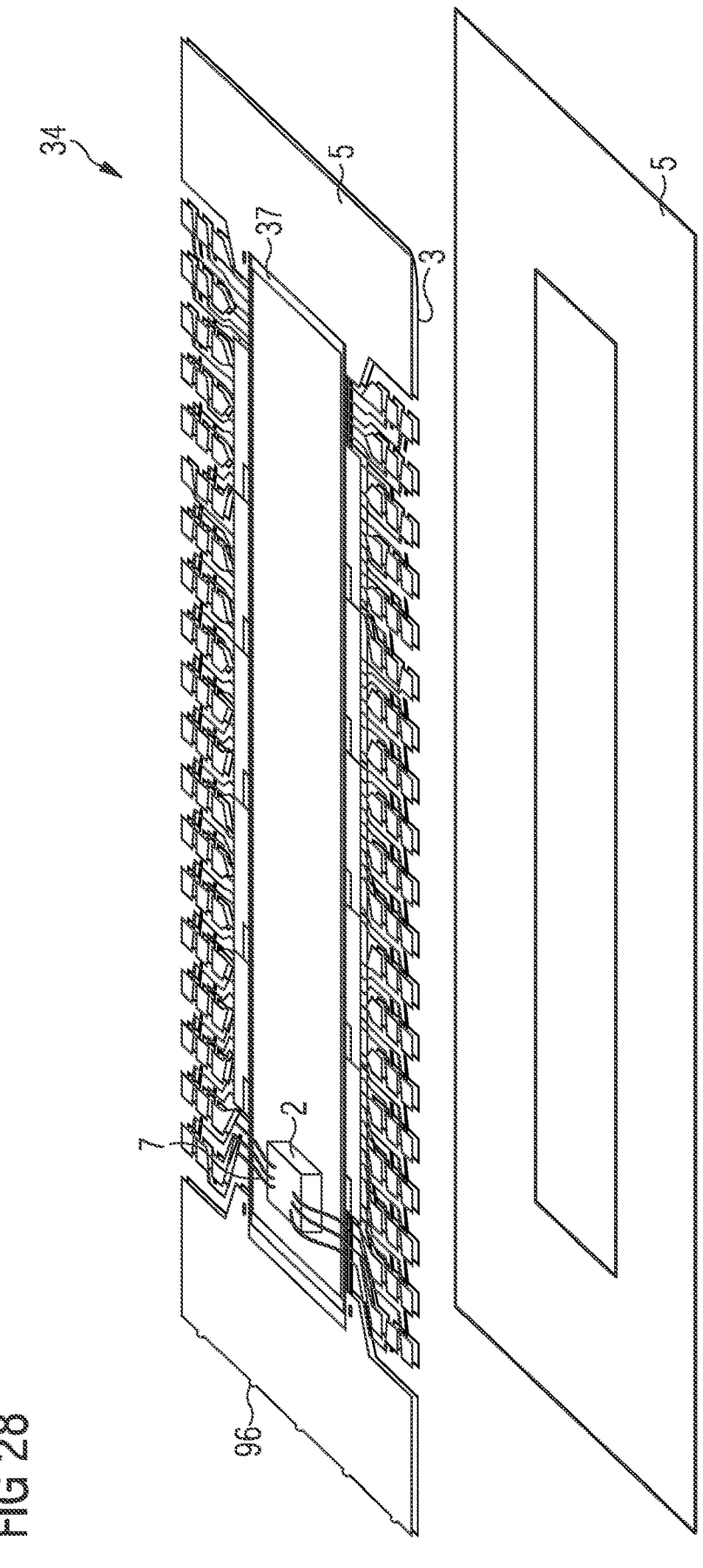
FIG. 28 shows a schematic perspective exploded view of an example of a mounting carrier for optoelectronic semiconductor components.
Figure 29:
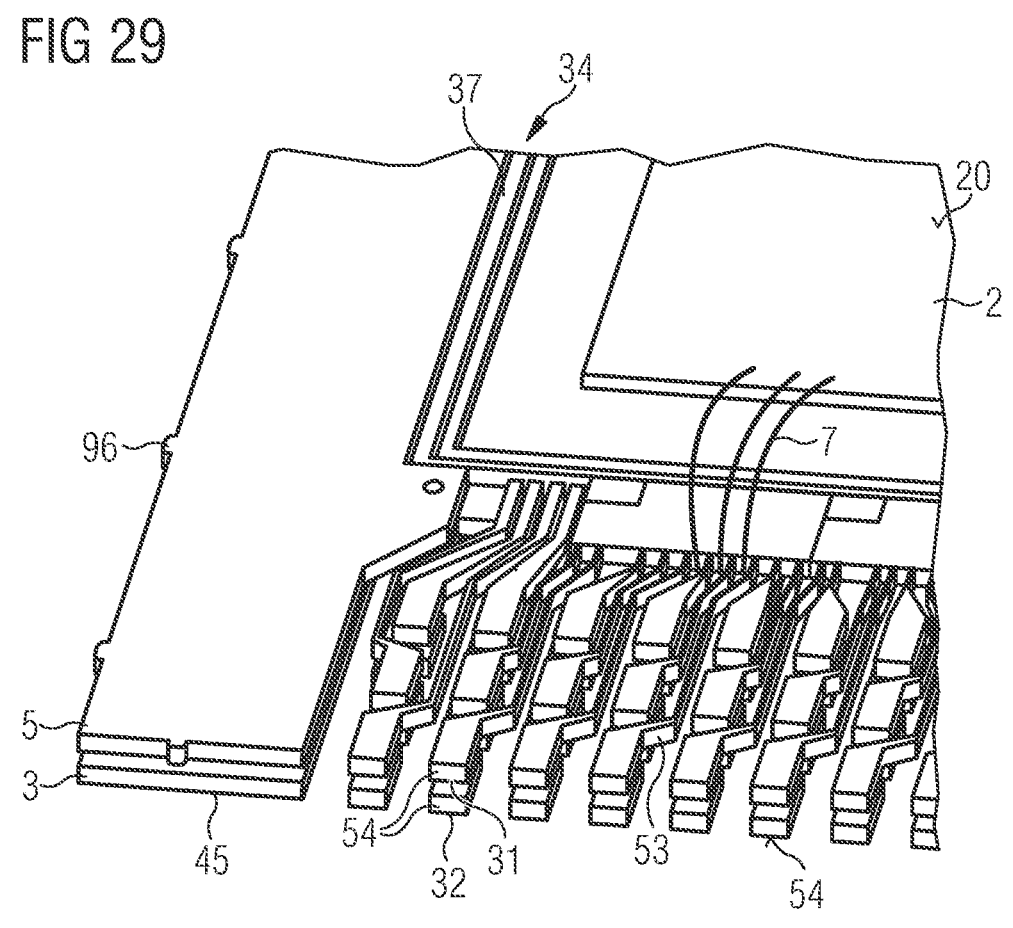
FIGS. 29 and 32 show detailed views of the mounting carrier of FIG. 28.
Figure 30:
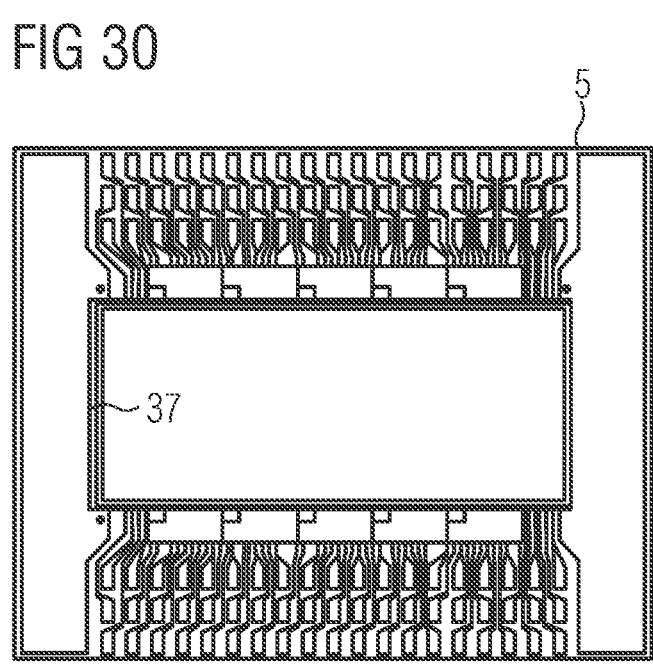
FIGS. 30 and 31 show schematic plan views of the metallization and lead frame parts of the mounting carrier of FIG. 28.
Figure 31:
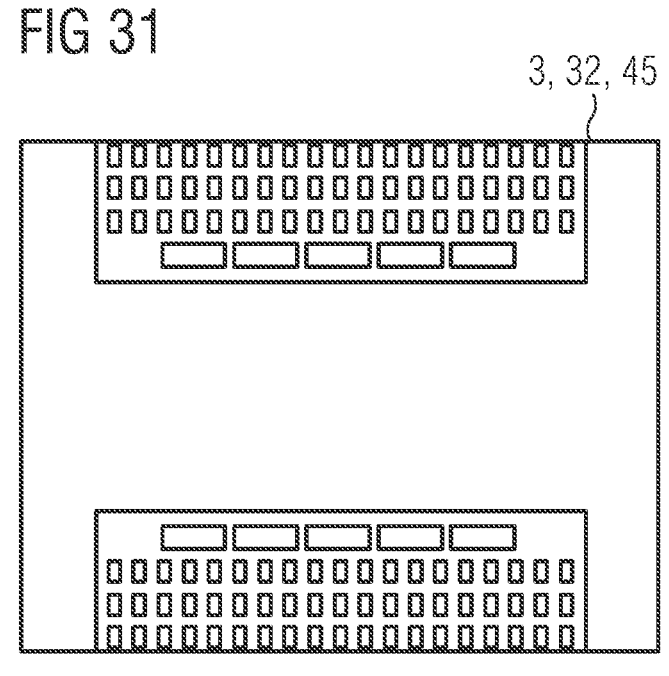
Figure 32:
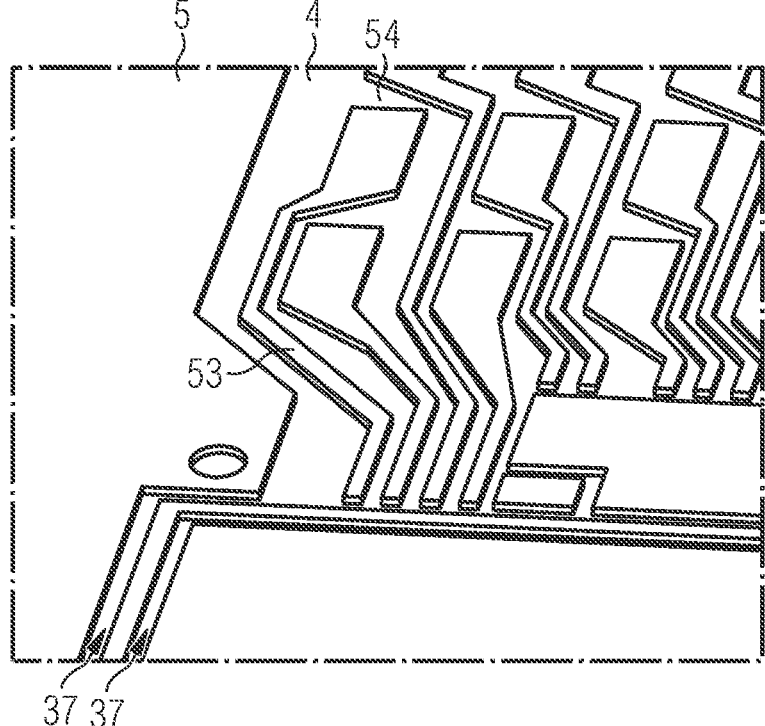

The mounting carrier 34 comprises a large, central lead frame part which is provided for mounting one or more semiconductor chips 2. In FIGS. 28 and 29, only a small semiconductor chip 2 is illustrated for this purpose for simplification. Optionally, a mounting area for the at least one semiconductor chip 2 is surrounded by a stop structure. In particular, the stop structure prevents an adhesive or solder used to attach the semiconductor chips 2 from reaching other areas of the mounting carrier 34. For example, the stop structure is designed as a double trench 37, see in particular FIGS. 29 and 32. As can be seen in FIG. 32, the stop structure can extend up to the casting body 4 and thus completely penetrate the metallization 5, next to the through-plating region of the largest lead frame part.

For example, the large, central lead frame part is laterally extended outside the stop structure so that this lead frame part can be I-shaped in plan view, with the stop structure located in the longitudinal beam of the I. The large, central lead frame part is preferably provided with the metallization 5 through which the stop structure may be formed. Substantially all of the large, central lead frame part is formed as a through-plating region. Thus, the casting body 4, see FIG. 28, lower figure portion, has the shape of a rectangular frame.

There are many small connection surfaces 54 along the longitudinal beam of the I, from which conductor tracks 53 extend. The connection surfaces 54 are arranged, for example, in several rows, in particular in three rows, along the longitudinal beam of the I. The connection surfaces 54 are preferably electrically contacted in that bonding wires 7 lead from the semiconductor chip 2 to the conductor tracks 53 and the conductor tracks 53 then run to the respective connection surfaces 54, see in particular FIGS. 29 and 32. This means that the connection surfaces 54 themselves can be free of the bonding wires. In this way, a plurality of semiconductor chips 2 or a single, large, pixelated optoelectronic semiconductor chip 2 can be efficiently electrically interconnected.

The smaller connection surfaces 54 are preferably overlapped by the horizontal beams of the I or are flush with horizontal beams in the direction away from the longitudinal beam of the I. In particular, connecting bars 96 can optionally be located on the horizontal beams to mechanically and optionally also electrically connect adjacent mounting carriers 34 in the carrier composite, not shown in FIGS. 28 to 32.

To reduce bending or warpage, the metallizations 5 and the lead frame parts 3 on the two main sides of the mounting carrier 34 are preferably of the same or approximately the same shape. This means that, in particular when neglecting the conductor tracks 53, the metallizations 5 and the mounting regions 32 of the lead frame parts 3 can be arranged congruently or approximately congruently in the vicinity of the connection surfaces 54, see in particular FIGS. 30 and 31. Approximately congruent means, for example, that the metallizations 5 and the mounting regions 32 overlap to at least 50% or 60% or 75% or also to at least 0% or 95% or 98% of a total area of all metallizations 5 taken together, as seen in plan view in particular of the contacting side 45 of the semiconductor component 1.

In all other respects, the description of FIGS. 1 to 27 applies equally to FIGS. 28 to 32.

Figure 33:
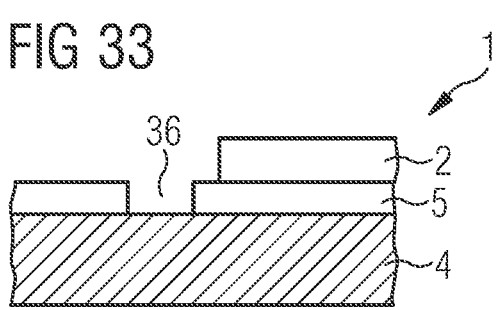
FIGS. 33 to 35 show schematic sectional views of examples of optoelectronic semiconductor components.
Figure 34:
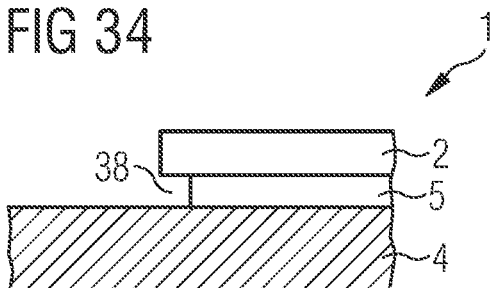
Figure 35:
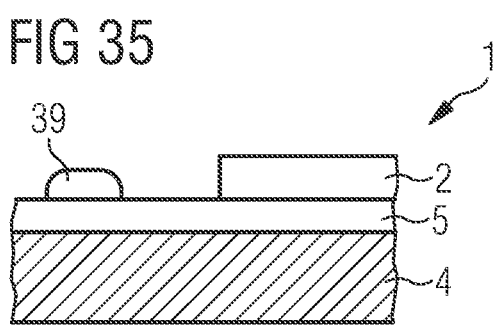
Figure 36:
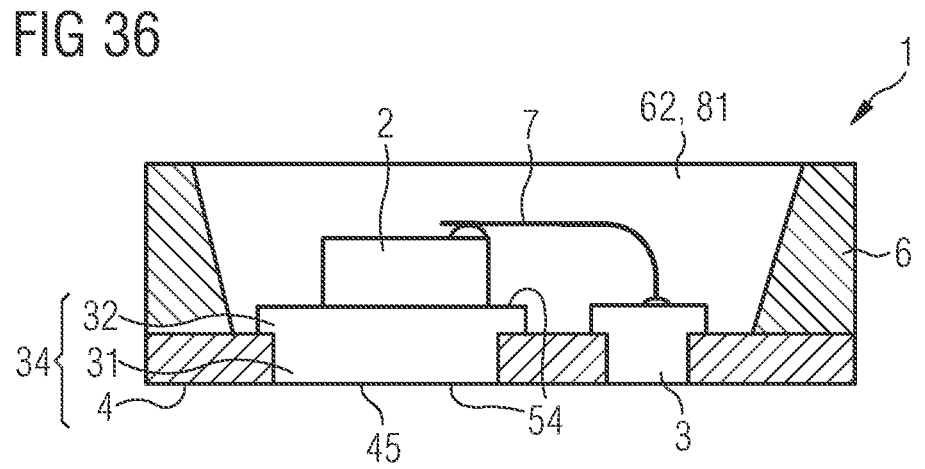
Figure 40:
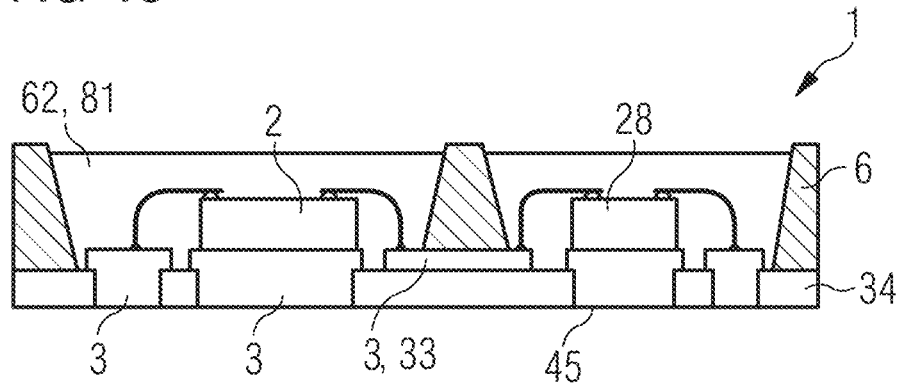
Figure 41:
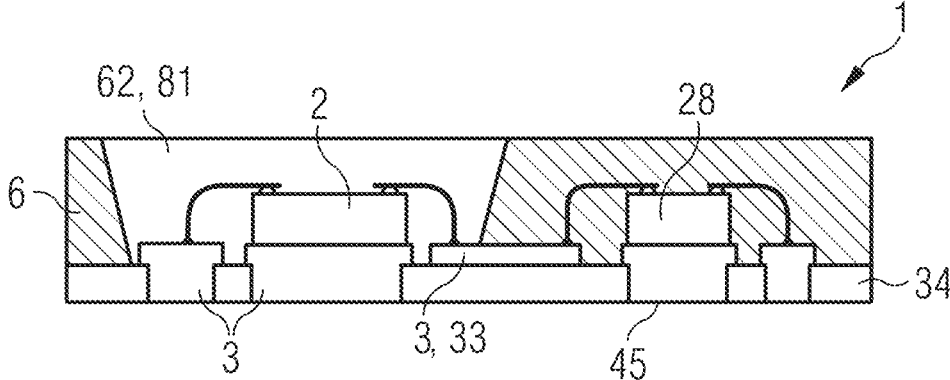

FIGS. 33 to 35 show alternative designs of the stop structure. These designs can be used in the same way in all other examples. The stop structures can also serve as anchoring structures for a molded body and/or a cover body and/or a phosphor body, not shown.

According to FIG. 33, the stop structure is not a double trench 37, as in FIGS. 28 to 32, but only a single trench 36. According to FIG. 34, the stop structure is designed as a countersink 38, in particular as a dimple hole or a dead-end trench. In this example, the countersink 38 is preferably located partially under the semiconductor chip 2, but can alternatively also be located completely next to the semiconductor chip 2. Finally, it is illustrated in FIG. 35 that the stop structure is implemented as a solder stop ring 39. The solder stop ring 39 is preferably made of a solder resist, hence, the name. However, other materials may be used for the solder stop ring 39. For example, the solder stop ring 39 is applied to the metallization 5.

In particular, the trench 36 as well as the solder stop ring 39 are preferably formed as structures surrounding the at least one semiconductor chip 2.

As mentioned above, in the examples, the metallizations 5 are each attached on the chip side, but it is also possible that the mounting regions 32 are interchanged in place with the metallizations 5. If this is the case, the description regarding the side of the mounting carrier 34 facing the semiconductor chip 2 in connection with the metallizations 5 apply accordingly to the lead frame parts 3.

In each of the preceding examples, the metallizations 5 are present. Likewise, it is possible to dispense with the metallizations 5, as illustrated in FIGS. 36 to 42. FIGS. 36 to 42, except for the metallizations 5, correspond essentially to FIGS. 1, 8, 9, 10, 12, 13 and 14, respectively, so that the description of FIGS. 1, 8, 9, 10, 12, 13 and 14 applies in the same way to FIGS. 36 to 42 in this respect.

Figure 42:
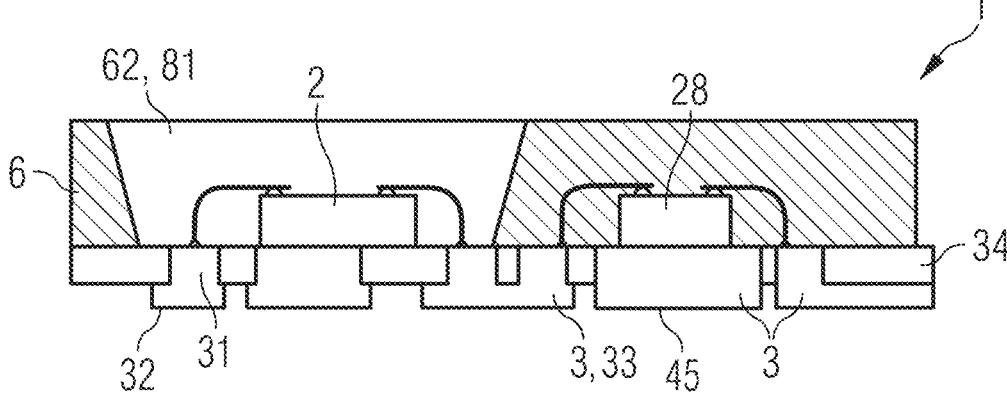

In FIGS. 36 to 41, the mounting regions 32 are each located on the chip side and the semiconductor chips 2 are attached to the mounting regions 32, whereas in FIG. 42 the mounting regions 32 are located on the contacting side 45. The conductor tracks 33 are each formed by lead frame parts 3. The mounting regions 32 each project beyond the casting body 4 in the direction away from the contacting side 45, see FIGS. 36 to 41, or in the direction away from the at least one semiconductor chip 2, see FIG. 42. Furthermore, the mounting regions 32 each project laterally beyond the at least one associated through-plating region 31.

The method step of FIG. 4 is thus omitted for manufacturing the mounting carriers 34 of FIGS. 36 to 42. In all other respects, the semiconductor components 1 of FIGS. 36 to 42 can be manufactured in the same way as the semiconductor components 1 described above.

The components shown in the figures preferably follow one another in the sequence indicated, in particular directly one after the other, unless otherwise described. Components not touching each other in the figures are preferably spaced apart. Insofar as lines are drawn parallel to one another, the associated surfaces are preferably likewise aligned parallel to one another. Furthermore, the relative positions of the drawn components to each other are correctly reproduced in the figures, unless otherwise specified.

My components and methods are not limited by the description based on the examples. Rather, this disclosure encompasses any new feature as well as any combination of features, which in particular includes any combination of features in the appended claims, even if the feature or combination itself is not explicitly stated in the claims or examples.

This application claims priority of German patent application 10 2020 004 863.3, the disclosure of which is hereby incorporated by reference.

The invention claimed is:

1. An optoelectronic semiconductor component comprising:
    at least one optoelectronic semiconductor chip,
    a plurality of lead frame parts,
    a casting body that mechanically connects the lead frame parts to one another so that a mounting carrier is formed on which the at least one optoelectronic semiconductor chip is mounted,
    a plurality of metallizations, and
    electrical connection surfaces for external electrical contacting of the semiconductor component,
    wherein
    the lead frame parts are each formed in one piece and comprise at least one through-plating region and at least one mounting region,
    the at least one through-plating region of each lead frame part penetrates the casting body and the at least one mounting region of each lead frame part projects beyond the casting body, each metallization starts from at least one of the through-plating regions and extend directly onto the casting body laterally next to the at least one associated through-plating region,
    the connection surfaces are formed by the mounting regions of the lead frame parts,
    the mounting regions are each at least as large as the at least one associated through-plating region, seen in plan view of a contacting side of the semiconductor component, configured for external electrical connection of the connection surfaces, and
    the mounting regions and the respectively associated metallizations are arranged congruently one above the other at the connection surfaces, seen in plan view of the contacting side.

2. The optoelectronic semiconductor component according to claim 1, further comprising:
    a molded body made of a light-impermeable material,
    the molded body being mounted on the mounting carrier and running all around the at least one optoelectronic semiconductor chip in a spaced manner so that a trough for the at least one optoelectronic semiconductor chip is formed by the molded body together with the mounting carrier.

3. The optoelectronic semiconductor component according to claim 1, wherein
    the at least one optoelectronic semiconductor chip is mounted on one of the lead frame parts, and
    a plurality of smaller lead frame parts is arranged around the largest lead frame part.

4. The optoelectronic semiconductor component according to claim 1, wherein the lead frame parts on a first main side of the mounting carrier and/or the metallizations on an opposite second main side of the mounting carrier form at least one electrical conductor track directly on the casting body, and
    the respective metallizations having a single-layer or multilayer structure.

5. The optoelectronic semiconductor component according to claim 4, further comprising a plurality of the conductor tracks, wherein
    a bonding wire is mounted on each of at least some of the conductor tracks, said bonding wire leading to another conductor track or to the at least one optoelectronic semiconductor chip.

6. The optoelectronic semiconductor component according to claim 4, further comprising a plurality of the conductor tracks, wherein at least two of the conductor tracks cross each other, as seen in plan view of the first main side.

7. The optoelectronic semiconductor component according to claim 1, wherein at least some of the metallizations have a base area larger by at least a factor of three than the at least one associated through-plating region.

8. The optoelectronic semiconductor component according to claim 1, further comprising:
    at least one further lead frame part formed of only one mounting region and/or at least one further metallization
    mounted on the casting body spaced apart from the lead frame parts.

9. The optoelectronic semiconductor component according to claim 1, wherein
    at least one of the lead frame parts has:
    a trench or double trench running around the at least one optoelectronic semiconductor chip,
    a countersink on or under the at least one optoelectronic semiconductor chip, a solder stop ring running around the at least one optoelectronic semiconductor chip, and/or an electrically non-functional metal ring running around the at least one optoelectronic semiconductor chip.

10. The optoelectronic semiconductor component according to claim 1, further comprising:

a cover body applied to the mounting carrier and which touches the at least one optoelectronic semiconductor chip, wherein the cover body is permeable to radiation to be generated and/or received by the at least one optoelectronic semiconductor chip.

11. The optoelectronic semiconductor component according to claim 10, wherein the cover body completely covers the at least one optoelectronic semiconductor chip.

12. The optoelectronic semiconductor component according to claim 1, wherein the at least one optoelectronic semiconductor chip forms part of an external upper surface of the semiconductor component.

13. The optoelectronic semiconductor component according to claim 1, wherein the metallization comprises a growth layer and a main layer thicker relative to the growth layer.

14. The optoelectronic semiconductor component according to claim 1, wherein the at least one optoelectronic semiconductor chip is selected from the group consisting of light-emitting diode, laser diode and photosensor, and the semiconductor component further comprises at least one drive chip for the at least one optoelectronic semiconductor chip so that the at least one drive chip is electrically connected to the at least one optoelectronic semiconductor chip.

15. The optoelectronic semiconductor component according to claim 1, further comprising a plurality of the optoelectronic semiconductor chips, wherein the casting body forms a plane-parallel plate.

16. The optoelectronic semiconductor component according to claim 15, wherein the molded body forms a plurality of troughs and the optoelectronic semiconductor chips are distributed among the troughs.

17. A method of manufacturing optoelectronic semiconductor components according to claim 1, comprising the following steps in order:

A) providing a carrier composite in which a plurality of the mounting carriers are combined, the casting body extending contiguously along all of the mounting carriers of the carrier composite, B) applying the optoelectronic semiconductor chips so that each of the mounting carriers is provided with at least one optoelectronic semiconductor chip, and D) dividing the carrier composite to form the semiconductor components.

18. The method according to claim 17, comprising between B) and D):

C) testing the optoelectronic semiconductor chips in the carrier composite, the optoelectronic semiconductor chips being individually electrically driven, wherein the testing in C) comprises:

C1) determining first color locations of emissions of the optoelectronic semiconductor chips without phosphor bodies, and/or C2) determining second color locations of emissions of the optoelectronic semiconductor chips during a creation of the phosphor bodies, and/or C3) determining third color locations of emissions of the optoelectronic semiconductor chips with the finished phosphor bodies, and wherein A) comprises:

A1) etching a metal sheet from one side, the metal sheet remaining a mechanical unit and the through-plating regions being formed, A2) producing the casting body on the etched metal sheet by casting, and A3) grinding the casting body so that the through-plating regions are exposed from excess material of the casting body.

19. The method according to claim 17, wherein the carrier composite comprises, up to D), a plurality of component fields spaced apart from one another, in the component fields, the mounting carriers are arranged close to one another and areas between the component fields are free of mounting carriers, adjacent component fields are connected to one another by metallic connecting webs located on the contiguous casting body, and the connecting webs have at least one branch and/or at least one meander.

* * * * *